(12) United States Patent
Kasamatsu et al.

(10) Patent No.: US 7,336,081 B2
(45) Date of Patent: Feb. 26, 2008

(54) CELL EVALUATION DEVICE INCLUDING SHORT CIRCUIT DETECTOR

(75) Inventors: Shinji Kasamatsu, Katano (JP); Hajime Nishino, Ikoma (JP); Mikinari Shimada, Yawata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 79 days.

(21) Appl. No.: 11/098,378

(22) Filed: Apr. 5, 2005

(65) Prior Publication Data

US 2005/0253591 A1 Nov. 17, 2005

(30) Foreign Application Priority Data

May 14, 2004 (JP) ............... 2004-145062

(51) Int. Cl.
*G01N 27/416* (2006.01)
(52) U.S. Cl. ............... 324/426; 324/432
(58) Field of Classification Search .......... 324/426, 324/432
See application file for complete search history.

(56) References Cited

U.S. PATENT DOCUMENTS 6,531,847 B1 * 3/2003 Tsukamoto et al. ......... 320/135

2001/0019270 A1 * 9/2001 Onishi et al. ............... 324/426

OTHER PUBLICATIONS

"Guidelines for Safety Evaluations of Secondary Lithium Cells", SBA G 1101-1997, Japan Storage Battery Association, Jan. 22, 1997, pp. 1-11, accompanied by an English language translation thereof.

"Guidelines for Safety Evaluations of Secondary Lithium Cells", SBA G 1101-1995, Japan Storage Battery Association, Jan. 25, 1995, pp. 1-13, accompanied by an English language translation thereof.

\* cited by examiner

*Primary Examiner*—Bao Q. Vu
*Assistant Examiner*—Ramy Ramadan
(74) *Attorney, Agent, or Firm*—Greenblum & Bernstein, P.L.C.

(57) ABSTRACT

A cell evaluation device has a short circuit detection portion to detect an internal short circuit within a test cell that has been subjected to nail penetration or crushing using the pressure from a pressurization portion, a pressure control portion to halt the operation of the pressurization portion on detection of a short circuit, and a cell information detection portion to collect and record cell information such as the cell temperature. By using such a cell evaluation device, the location of an internal short circuit during an abuse test is specified, and variations in the cell temperature increase accompanying the internal short circuit is minimized.

15 Claims, 2 Drawing Sheets

CELL EVALUATION DEVICE INCLUDING SHORT CIRCUIT DETECTOR

The present disclosure relates to subject matter contained in priority Japanese Patent Application No. 2004-145062, filed on May 14, 2004, the contents of which is herein expressly incorporated by reference in its entirety.

BACKGROUND OF THE INVENTION

1. Field of the Invention

The present invention relates to a cell evaluation device for evaluating the safety of a cell on the basis of cell information obtained by causing an intentional internal short circuit using either a nail penetration test or a crush test.

2. Description of the Related Art

In cells such as rechargeable lithium ion cells that use a flammable organic electrolyte, although safety functions such as protection circuits are provided to ensure that abuse of the cell or faults within the connected equipment do not cause overheating within the cell, these safety functions are not designed to cope with extreme examples of abuse. However, safety standards are set so that even in cases of extreme abuse, thermal runaway does not lead to explosion or ignition of the cell. Such safety standards demand that even in cell evaluation tests conducted under the most severe conditions, explosion or ignition of the cell does not occur. These cell evaluation tests are prescribed by the UL standard used for lithium cells (UL1642), and within guidelines issued by the Japan Storage Battery Association (see "Guidelines for safety evaluations of rechargeable lithium cells," G1101-1997).

Test items are broadly classified into electrical tests, mechanical tests, and environmental tests. Within the mechanical tests that represent the target for the present invention, abuse tests include the nail penetration test and the crush test. In the case of the nail penetration test, a fully charged fresh cell, and a cell that has fallen to half its rated capacity are used as test cells, and a nail is punched perpendicularly through the electrode surfaces from a point near the middle of the sidewall of each test cell. The standard requires that neither explosion nor ignition occurs, even if the test cells are left in this punctured state for 6 hours or longer.

However, conventional nail penetration and crush tests simply specify the insertion of a nail either right through, or to a certain depth within, the test cell, or the crushing of the cell with a predetermined pressure respectively. Accordingly, the location of the short circuit generated by the nail penetration or the crushing varies from test to test, meaning the short circuit location cannot be specified, and the temperature variation arising from Joule heating caused by the short circuit current is not stable.

Furthermore, the size of the short circuit current that flows as a result of the internal short circuit caused by the nail penetration or the crushing is determined by the internal resistance of the cell. Consequently, during the evaluation of different cells, the Joule heating caused by the short circuit current, and the heating caused by chemical reactions between the component materials of the cell, differ considerably, meaning accurately determining the cause of cell temperature variations has been impossible. In addition, in those cases where an internal short circuit occurs within one cell of a battery pack or the like, where a plurality of cells are connected in parallel, increases in the cell temperature caused by short circuit current flowing from other cells within the parallel connected pack have been unable to be evaluated. Moreover, when evaluation is required for a cell in which cycle degradation or high temperature degradation has caused an increase in internal resistance, a cycle degraded cell or high temperature degraded cell must first be prepared for the purposes of testing.

SUMMARY OF THE INVENTION

The present invention takes the problems described above into consideration, with an object of providing a cell evaluation device which enables the location of an internal short circuit to be specified, and generates minimal variation in the increase in cell temperature accompanying the internal short circuit during abuse tests, is applicable when multiple cells are arranged in parallel, and used for the evaluation of degraded cells without prior preparation.

In order to achieve the above object, a first aspect of the present invention provides a cell evaluation device for evaluating the safety of a cell based on a state of a test cell when pressurization means is used to forcibly generate an internal short circuit within the test cell, comprising: short circuit detection means for detecting the occurrence of an internal short circuit within the test cell; pressure control means for controlling the pressurization operation of the pressurization means once the short circuit detection means has detected an internal short circuit; and cell information detection means for detecting the state of the test cell.

According to this first aspect, because the short circuit detection means detects when an internal short circuit is generated by application of pressure by the pressurization means, a short circuit detection output to the pressure control means is used to halt the pressurization of the test cell by the pressurization means. Accordingly, there is minimal variation in the location at which the internal short circuit occurs, and minimal variation in information such as the cell temperature detected by the cell information detection means. This enables a more reliable evaluation of the phenomena occurring within the cell during nail penetration or crushing, and also enables the location of the internal short circuit to be specified.

A second aspect of the present invention provides a cell evaluation device for evaluating the safety of a cell based on a state of a test cell when pressurization means is used to forcibly generate an internal short circuit within the test cell, comprising: short circuit detection means for detecting the occurrence of an internal short circuit within the test cell; pressure control means for controlling the pressurization operation of the pressurization means once the short circuit detection means has detected an internal short circuit; cell information detection means for detecting the state of the test cell; and short circuit current control means for controlling the current flowing through the test cell in the charge direction or the discharge direction once the short circuit detection means has detected an internal short circuit.

According to this second aspect, if the short circuit current control means causes a current to flow through the test cell in the charge direction once the short circuit detection means has detected an internal short circuit within the test cell, then an operating state is achieved that artificially reproduces the state wherein other cells are connected in parallel to the test cell, thus enabling verification of the test cell behavior under conditions in which other parallel cells exist. Furthermore, if the short circuit current control means causes a current to flow through the test cell in the discharge direction once the short circuit detection means has detected an internal short circuit within the test cell, then the short circuit current accompanying the internal short circuit within the test cell is dispersed, enabling artificial reproduction of a state in which the test cell has degraded, leading to increased internal resistance. This enables the verification of the behavior within a degraded test cell, without requiring the prior preparation of such a cell.

While novel features of the invention are set forth in the preceding, the invention, both as to organization and content, can be further understood and appreciated, along with other objects and features thereof, from the following detailed description and examples when taken in conjunction with the attached drawings.

DETAILED DESCRIPTION OF THE PREFERRED EMBODIMENTS

As follows is a description of embodiments of a cell evaluation device according to the present invention, with reference to the drawings.

Figure 1:
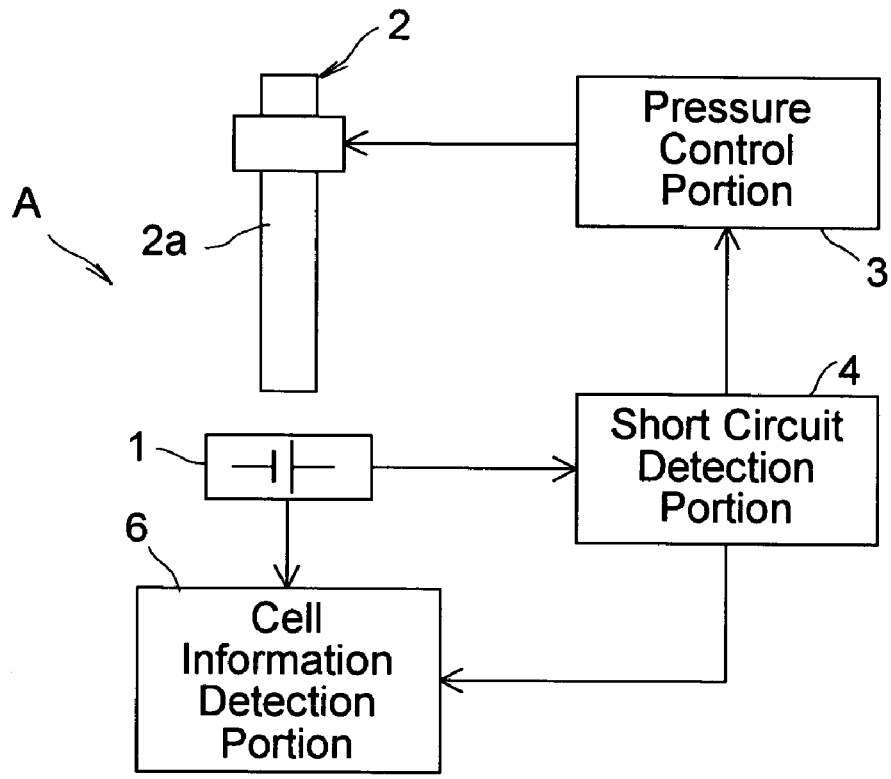
FIG. 1 is a block diagram showing the structure of a cell evaluation device according to a first embodiment.

FIG. 1 shows the structure of a cell evaluation device A according to a first embodiment. A test cell 1 disposed in a predetermined position is connected to a short circuit detection portion 4 and a cell information detection portion 6, in order to enable control of a pressurized state caused by nail penetration or crushing of the test cell 1 by a pressurization portion 2, and enable detection of the state of the pressurized test cell 1.

The pressurization portion 2 comprises a rod 2a which is extended towards the test cell 1 using a pressurization device not shown in the figure. A nail penetration test will be conducted by fitting a nail to the tip of this rod 2a, whereas a crush test will be performed by fitting a flat plate or apiece of squared timber to the tip of the rod 2a. The pressurization device is capable of applying a pressurization force of 0.1 to 30 kN to the rod 2a at a pressing speed of 0.1 to 180 mm/s. A variety of pressurization systems may be used for the pressurization device, and any system capable of controlling the movement of the rod 2a towards the cell is acceptable. Examples of suitable pressurization systems include screw systems using a servo motor, post guide screw systems, pendulum systems, lever systems, crank systems, mechanical press systems, hydraulic press systems, and air press systems. A pressure control portion 3 controls the pressurization device, and stops the movement of the rod 2a at any position.

Figure 2:
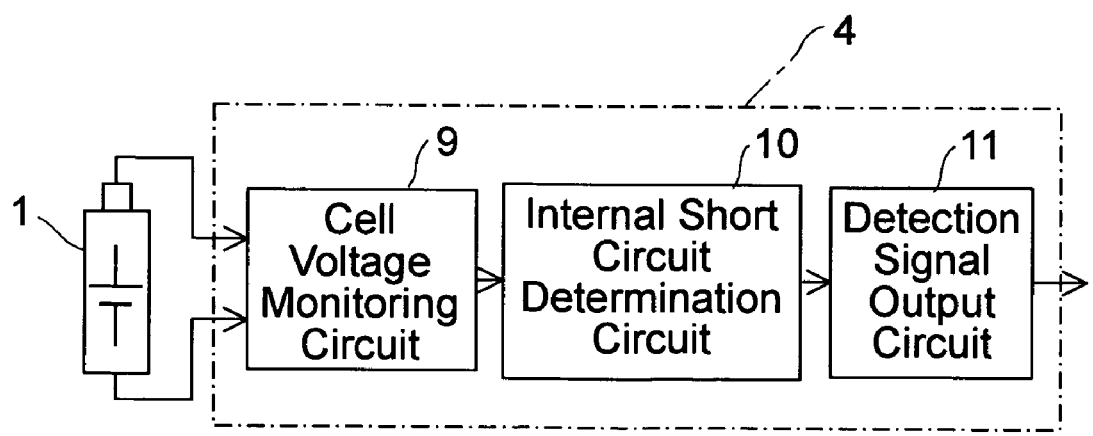
FIG. 2 is block diagram showing the structure of a short circuit detection portion within the cell evaluation device.

The short circuit detection portion 4 detects changes in the information obtained from the test cell 1 as it is pressurized by the pressurization portion 2, thereby enabling detection of internal short circuits within the test cell 1. In this embodiment, the short circuit detection portion 4 monitors the voltage of the test cell 1, and detects an internal short circuit as a change in the cell voltage. As shown in FIG. 2, the short circuit detection portion 4 comprises a cell voltage monitoring circuit 9, which is connected across the positive and negative electrode terminals of the test cell 1, and monitors the cell voltage, an internal short circuit determination circuit 10, which compares the cell voltage detected by the cell voltage monitoring circuit 9 with a preset reference voltage, and determines the existence of an internal short circuit when the detected cell voltage has fallen below the reference voltage, and a detection signal output circuit 11, which outputs a short circuit detection signal when the internal short circuit determination circuit 10 determines the existence of an internal short circuit. The short circuit detection signal output by the detection signal output circuit 11 is sent to the pressure control portion 3 and the cell information detection portion 6.

The cell information detection portion 6 collects and stores cell information such as the cell temperature, which is detected by a temperature sensor such as a thermocouple attached to the test cell 1, as well as the cell voltage and the internal cell pressure. Because the cell voltage changes within an extremely short period of time when an internal short circuit occurs, the cell information detection portion 6 comprises a data logger that is capable of information collection with a very short sampling interval of no more than 10 msec.

To use a cell evaluation device A of the above configuration to perform a nail penetration test, a nail is first attached to the tip of the rod 2a of the pressurization portion 2, a test cell 1 is placed in the predetermined position, and operation of the cell evaluation device A is commenced. Operating the pressurization portion 2 causes the rod 2a to move towards the test cell 1, and the nail attached to the tip of the rod 2a pierces the casing and penetrates the body of the test cell 1. When this nail penetration causes an internal short circuit, by causing a continuity link between the positive and negative electrode plates of the test cell 1, the short circuit is detected by the short circuit detection portion 4 on the basis of the monitored cell voltage, and a detection output signal is sent to the pressure control portion 3. On receipt of this detection output signal, the pressure control portion 3 halts the movement of the rod 2a of the pressurization portion 2. The internal short circuit detection output signal from the short circuit detection portion 4 is also sent to the cell information detection portion 6, and information on the variation in cell temperature and cell voltage and the like caused by the short circuit is collected and stored. A specific example of a nail penetration test conducted using this cell evaluation device A is described below.

A test cell 1 consisting of a cylindrical rechargeable lithium ion cell (CGR18650HG, manufactured by Matsushita Battery Industrial Co., Ltd.) that had been fully charged with a charging voltage of 4.2V was subjected to a nail penetration test. The nail used was a commercially available round steel nail with a diameter of 3 mm. The pressurization conditions under which pressure was applied to the nail using the pressurization portion 2 included a pressing speed of 20 mm/s, and a maximum pressurization force of 30 kN.

The cell voltage monitoring circuit 9 of the short circuit detection portion 4 is used to monitor the voltage of the test cell 1, and when the cell voltage falls below a preset reference voltage of 3V, the internal short circuit determination circuit 10 determines that the nail has penetrated the test cell 1, under the pressure applied by the pressurization portion 2, thereby causing an internal short circuit. At this point, a detection signal is immediately output by the detection signal output circuit 11, and sent to the pressure control portion 3. On receipt of this internal short circuit detection signal, the pressure control portion 3 causes the pressurization portion 2 to immediately halt any further movement of the rod 2a. As a result of this control operation, an internal short circuit is caused between the positive and negative electrode plates, which are wound in a plurality of layers, and the nail penetrating the test cell 1 is halted at a point near the layer at which the internal short circuit was caused. Furthermore, because the internal short circuit detection signal output by the short circuit detection portion 4 is also sent to the cell information detection portion 6, the cell information detection portion 6 is able to continuously collect and store information such as the temperature and voltage of the test cell 1 across a predetermined period immediately prior to, and then following, the internal short circuit.

The above nail penetration test was conducted on 10 individual test cells 1, and for the purposes of comparison, further 10 test cells 1 were subjected to a conventional nail penetration test, where the nail is pierced completely through the cell with no monitoring of short circuits. During the conducting of this example 1 and comparative example 1, the surface temperature of the test cell 1 was measured continuously for a predetermined period using the cell information detection portion 6, and the maximum cell temperature was recorded. Furthermore, following completion of each nail penetration test, the test cell 1 was disassembled, and the number of layers through which the nail had penetrated in causing the short circuit was counted. The results for the nail penetration test of the example 1 and the comparative example 1 are shown in Table 1.

TABLE 1

| Test Number | Example 1 | | Comparative Example 1 | |
|---|---|---|---|---|
| | Short Circuit Layers | Max. Cell Temperature ° C. | Short Circuit Layers | Max. Cell Temperature ° C. |
| 1 | 3 | 120 | 35 | 129 |
| 2 | 3 | 112 | 35 | 123 |
| 3 | 3 | 116 | 35 | 110 |
| 4 | 3 | 122 | 35 | 107 |
| 5 | 3 | 118 | 35 | 126 |
| 6 | 3 | 120 | 35 | 115 |
| 7 | 3 | 115 | 35 | 123 |
| 8 | 3 | 118 | 35 | 102 |
| 9 | 3 | 119 | 35 | 124 |
| 10 | 3 | 123 | 35 | 126 |
| Average | 3 | 118 | 35 | 119 |
| σ | 0.0 | 3.3 | 0.0 | 9.3 |

As is evident from Table 1, the results for the example 1, which represent the nail penetration tests conducted using the cell evaluation device A according to the first embodiment of the present invention, are capable of specifying the location at which the penetration of the nail first caused an internal short circuit. Because a stable short circuit point is achieved, the variation (σ) in the heating of the test cell 1, caused by the Joule heating generated by the short circuit current accompanying the internal short circuit, is minimal, and the maximum temperature reached by the cell under the extreme abuse conditions of nail penetration is ascertained. In other words, based on the maximum temperature detected during the internal short circuit, a judgment is made as to whether the test cell 1 is likely to explode or ignite during the nail penetration test.

In contrast, in the conventional nail penetration tests of the comparative example 1, the nail penetrated right through the test cell 1, meaning an internal short circuit occurs at all layers. Because the flow of the resulting short circuit current varies considerably from test to test, the variation (σ) in the level of temperature increase is large, making it difficult to determine the maximum temperature reached by the cell under the extreme conditions of nail penetration.

Figure 3:
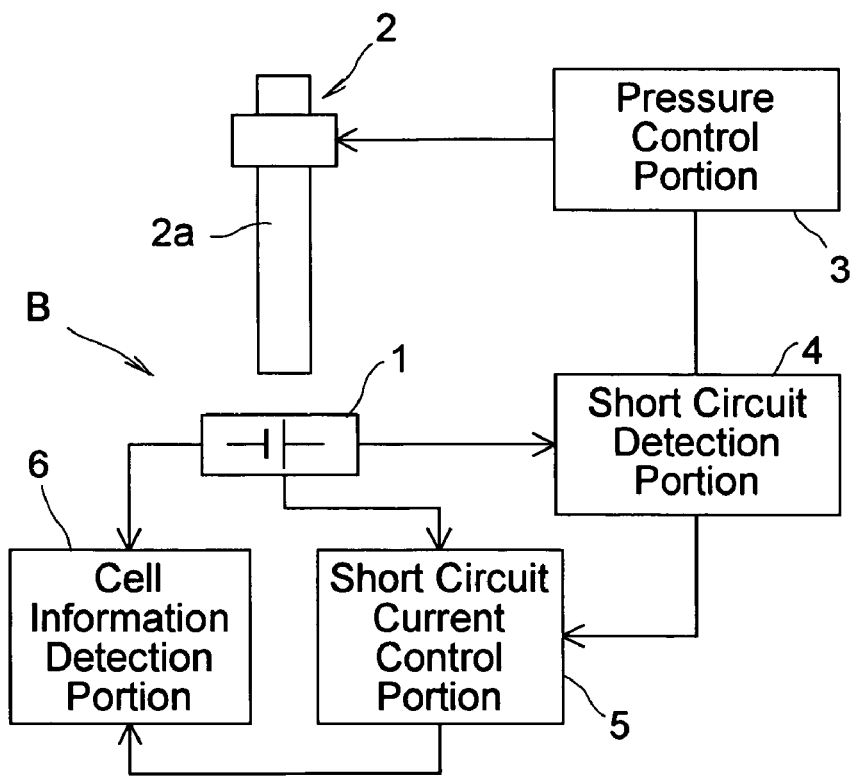
FIG. 3 is a block diagram showing the structure of a cell evaluation device according to a second embodiment.
Figure 4:
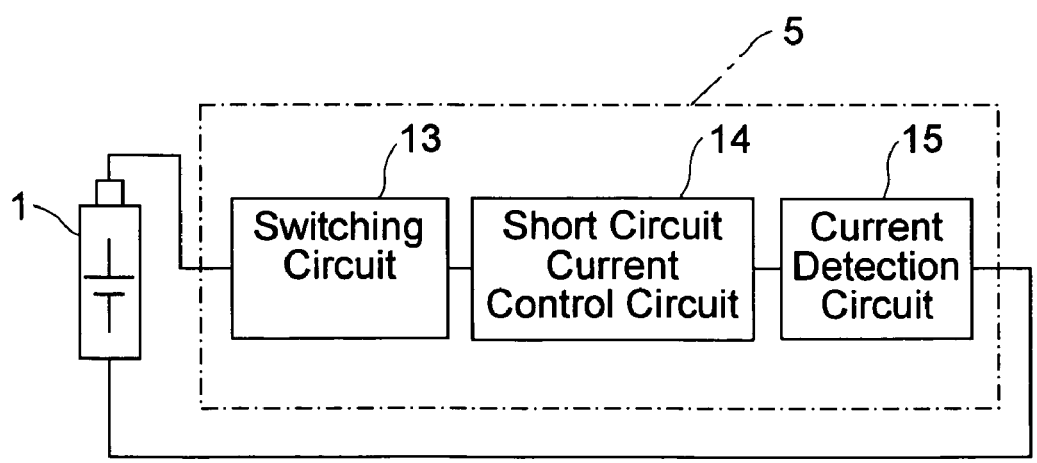
FIG. 4 is block diagram showing the structure of a short circuit current control portion within the cell evaluation device.

Next is a description of a cell evaluation device B according to a second embodiment of the present invention, with reference to FIG. 3 and FIG. 4. This embodiment enables the evaluation of states which artificially reproduce either a state wherein other cells are connected in parallel to the test cell subjected to the nail penetration test, or a state in which the test cell has degraded, leading to increased internal resistance.

Cells are not always used in isolation, and in many cases, a plurality of cells are connected together in a series and/or parallel arrangement. When an internal short circuit occurs, if another cell is connected in parallel, then short circuit current is also supplied to the short circuited cell from the other parallel cell. This excessive current causes an increase in the extent of the cell temperature increase caused by the internal short circuit, meaning a device that is capable of artificially reproducing this situation of parallel connected cells offers an extremely useful cell evaluation tool.

Furthermore, in the aforementioned guidelines for safety evaluations of rechargeable lithium ion cells set by the Japan Storage Battery Association, nail penetration tests and crush tests are conducted using both fully charged fresh cells, and cells that have fallen to approximately half of their rated capacity. Cells that display reduced capacity, namely degraded cells, display increased internal resistance, and if this state can be reproduced artificially, then test cells that have undergone a suitable level of degradation need not be prepared in advance, and the cell evaluation will instead be conducted by artificially reproducing the required state of degradation.

FIG. 3 shows the structure of a cell evaluation device B according to a second embodiment. Those structural elements that are common to the first embodiment are labeled with the same reference symbols, and their description is omitted here. The cell evaluation device B according to the second embodiment includes an additional short circuit current control portion 5, in addition to the structural elements provided in the first embodiment.

As shown in FIG. 4, the short circuit current control portion 5 comprises a switching circuit 13, a short circuit current control circuit 14, and a current detection circuit 15, which are connected in series to the test cell 1. When the state of a test cell 1 in an arrangement with a parallel connected cell needs to be artificially reproduced, a direct current source is connected to the short circuit current control circuit 14.

When a nail penetration test is initiated, and an internal short circuit is detected by the short circuit detection portion 4, a short circuit detection signal is sent to the short circuit current control portion 5. On the basis of this signal, the switching circuit 13 closes the connection circuit to the test cell 1, and a direct current is applied to the test cell 1 in the charge direction from the direct current source connected to the short circuit current control circuit 14. As a result of operation of the short circuit current control portion 5 in this manner, the current flowing through the test cell 1 becomes a combination of the short circuit current generated by the internal short circuit caused by the nail penetration, and the direct current supplied by the direct current source, resulting in a state of excessive current within the test cell 1.

In an example 2 shown in Table 2, direct current from the short circuit current control portion 5 is caused to flow through a test cell 1 that has been short circuited by nail penetration, thus reproducing a state in which short circuit current flows into the test cell 1 from a parallel connected cell. This example produces a state in which the short circuit current is considerably larger than that observed for a single test cell 1, and the temperature increase is also larger than that observed in the case of a short circuit within a single test cell 1.

In order to conduct a verification of an artificially degraded test cell 1, a resistance load commensurate with the increase in internal resistance generated as a result of cell degradation is connected to the short circuit current control circuit 14. In the examples 3 and 4 shown in Table 2, electronic loads with the required resistance values are connected as the short circuit current control circuit 14, thereby causing the short circuit current to flow from the test cell 1 in the discharge direction when an internal short circuit is caused by nail penetration. Accordingly, the short circuit current of the short circuited test cell 1 is dispersed across the location of the short circuit and the externally connected electronic load. This causes a reduction in the short circuit current flowing through the test cell 1, resulting in a recorded reduction in the maximum cell temperature.

TABLE 2

|  | Example 2 | Example 3 | Example 4 | Comparative Example 2 |
|---|---|---|---|---|
| Short Circuit Current Control Portion | Direct Current Source | Electronic Load | Electronic Load | — |
| Control Method | Constant Voltage 4.2 V | Constant Resistance 0.05 Ω | Constant Resistance 0.05 Ω | — |
| Short Circuit Current | Charge 10A | Discharge 34A | Discharge 13A | — |
| Max. Cell Temperature | 132° C. | 82° C. | 98° C. | 120° C. |

In the structures described above, when an internal short circuit is detected in the test cell 1 by the short circuit detection portion 4, the short circuit detection output signal may also be used to initiate operation of a high speed camera or a thermoviewer, so that the external changes in the test cell 1 caused by the internal short circuit is also observed.

Furthermore, although the descriptions of the above embodiments focused on nail penetration tests, crush tests, in which the pressurization portion 2 is used to apply a planar pressure to the test cell 1, may also be conducted in a similar manner.

Moreover, although the above embodiments were described using a rechargeable lithium ion cell as the test cell 1, safety evaluations can also be conducted for other cells, regardless of whether they are non-rechargeable or rechargeable.

As described above, the present invention provides a cell evaluation device for conducting a nail penetration test or crush test, wherein the pressurization process is halted when an internal short circuit is detected within the test cell. Consequently, the location at which the internal short circuit has occurred is specified, and evaluations is performed with minimal variation in the cell behavior accompanying the internal short circuit. In addition, the cell evaluation device enables the artificial reproduction of states in which another cell is connected in parallel to the test cell, and states in which the test cell has undergone degradation.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A cell evaluation device for evaluating the safety of a cell based on a state of a test cell when pressure is used to forcibly generate an internal short circuit within the test cell, the cell evaluation device comprising:
   a short circuit detector for detecting the occurrence of an internal short circuit within the test cell, the test cell including an electrolyte solution;
   a pressure controller for controlling the pressure applied once the short circuit detector has detected the internal short circuit; and
   a cell information detector for detecting the state of the test cell,
   wherein said short circuit detector is configured, upon detection of the internal short circuit within the test cell, to output a short circuit detection signal to the pressure controller and to the cell information detector.

2. A cell evaluation device for evaluating the safety of a cell based on a state of a test cell when pressure is used to forcibly generate an internal short circuit within the test cell, the cell evaluation device comprising:
   a short circuit detector for detecting the occurrence of an internal short circuit within the test cell;
   a pressure controller for controlling the pressure once the short circuit detector has detected an internal short circuit;
   a cell information detector for detecting the state of the test cell; and
   a short circuit current controller for controlling the current flowing through the test cell to flow in the charge direction or to flow the discharge direction once the short circuit detector has detected the internal short circuit
   wherein said short circuit current controller comprises a switching circuit, a short circuit current control circuit and a current detection circuit connected in series to the test cell, and
   wherein, when the internal short circuit is detected by said short circuit detector, a detection signal is sent to the switching circuit of the short circuit current controller.

3. The cell evaluation device according to claim 1, wherein
   the short circuit detector detects the internal short circuit based on voltage variations across a positive electrode and a negative electrode of the test cell.

4. The cell evaluation device according to claim 1, wherein
   the cell information detector detects a cell temperature, a cell voltage, and a cell internal pressure.

5. The cell evaluation device according to claim 2, wherein
   the cell information detector detects a cell temperature, a cell voltage, a cell internal pressure, and a control current of the short circuit current controller.

6. The cell evaluation device according to claim 2, wherein
   the short circuit current controller causes a current flow from a direct current source through the test cell in a charge direction once the short circuit detector has detected the internal short circuit.

7. The cell evaluation device according to claim 2, wherein the short circuit current controller connects a load to the test cell and causes a current flow in a discharge direction once the short circuit detector has detected the internal short circuit.

8. The cell evaluation device according to claim 2, wherein
the short circuit detector detects an internal short circuit based on voltage variations across a positive electrode and a negative electrode of the test cell.

9. The cell evaluation device according to claim 1, the test cell including at least one electrode plate group together with the electrolyte solution.

10. The cell evaluation device according to claim 2, the test cell including at least one electrode plate group and an electrolyte solution.

11. The cell evaluation device according to claim 1, wherein said pressure controller is configured to control the pressure in response to detection of the internal short circuit by said short circuit detector.

12. The cell evaluation device according to claim 2, wherein the pressure controller controls the pressure in response to detection of the internal short circuit by said short circuit detector.

13. The cell evaluation device according to claim 1, wherein said short circuit detector comprises a cell voltage monitoring circuit connected to a short circuit determination circuit, the short circuit determination circuit that is configured to compare a cell voltage detected by the cell voltage monitoring circuit with a preset reference voltage and to determine the existence of an internal short circuit when the detected cell voltage is below the reference voltage.

14. The cell evaluation device according to claim 2, wherein said short circuit detector comprises a cell voltage monitoring circuit connected to a short circuit determination circuit, the short circuit determination circuit being configured to compare a cell voltage detected by the cell voltage monitoring circuit with a preset reference voltage and to determine the existence of an internal short circuit when the detected cell voltage is below the reference voltage.

15. The cell evaluation device according to claim 1, said cell information detector being configured to collect and store information including at least a cell temperature.

* * * * *